May 11, 1954 R. E. RAWLINS 2,678,426

FREQUENCY MODULATING CIRCUITS

Filed June 17, 1949 2 Sheets-Sheet 1

INVENTOR.
ROBERT E. RAWLINS
BY George C. Sullivan
Agent

May 11, 1954 R. E. RAWLINS 2,678,426

FREQUENCY MODULATING CIRCUITS

Filed June 17, 1949 2 Sheets-Sheet 2

INVENTOR.
ROBERT E. RAWLINS

BY George C. Sullivan
Agent

Patented May 11, 1954 2,678,426

UNITED STATES PATENT OFFICE 2,678,426

FREQUENCY MODULATING CIRCUITS

Robert E. Rawlins, North Hollywood, Calif., assignor to Lockheed Aircraft Corporation, Burbank, Calif.

Application June 17, 1949, Serial No. 99,690

13 Claims. (Cl. 332—18)

This invention relates to equipment for producing frequency modulations in signal transmitting systems, and the like, and relates more particularly to frequency modulating circuits.

One of the most common means of producing frequency modulation in radio and telemetering transmitters has been the oscillator-reactance-tube combination. In such conventional circuits the reactance tube and its associated circuit components are added to a radio-frequency oscillator circuit which is usually complete in itself. These additions increase the complexity of the circuit resulting in particularly poor performance at higher frequencies. In addition, adjustments of such combined circuits are critical and extremely inter-dependent and the efficiency is decreased due to the loading effect of the modulator circuit itself and due to additional losses caused by the increased complexity of the radio-frequency circuit. Furthermore, variations in loading of the oscillator produce excessive variations in the modulation sensitivity or so-called "deviation ratio" (sometimes expressed as change in frequency per modulating volt). Recently, other frequency modulating circuits have been introduced but so far as I am aware they have not proved to be entirely satisfactory in all applications due to the limited power output obtainable and the relatively low efficiency of the circuits. Employing conventional vacuum tubes in these later circuits high-frequency limitations are more serious than with normal operations of the tubes.

It is a general object of the present invention to provide extremely simple and altogther practical frequency modulating circuits for producing frequency modulated radio frequency signals.

Another object of this invention is to provide a frequency modulating circuit having high output in terms of the power capabilities of the oscillator tube and high efficiency of operation. Because the oscillator operates efficiently at relative high frequencies (in fact there are no important limitations on its operation as a function of increasing frequency other than those which are effective when the same tube is used as an unmodulated oscillator) the modulated oscillator may be operated at a higher frequency than other circuits designed for the same purpose, reducing or eliminating the need for frequency multipliers which are usually less efficient than amplifiers. Standard or conventional vacuum tubes may be used in the circuit of the invention under normal optimum operating conditions (i. e., unmodulated) to obtain maximum output. Loading of the frequency modulating circuit produces little or no change in modulation sensitivity, or deviation ratio, and due to the high output capabilities of the circuit a modulated oscillator may, in some applications, be used without an amplifier particularly where space and power requirements are severe or limited.

A further and important object of the invention is to provide frequency modulating circuits of the character referred to that are simple and straightforward to adjust. The adjustments are small in number and relatively independent, and may be easily and quickly effected.

Other objectives and advantages of the invention will become apparent from the following detailed description of typical preferred embodiments, throughout which description reference will be made to the accompanying drawings in which.

Figure 1:
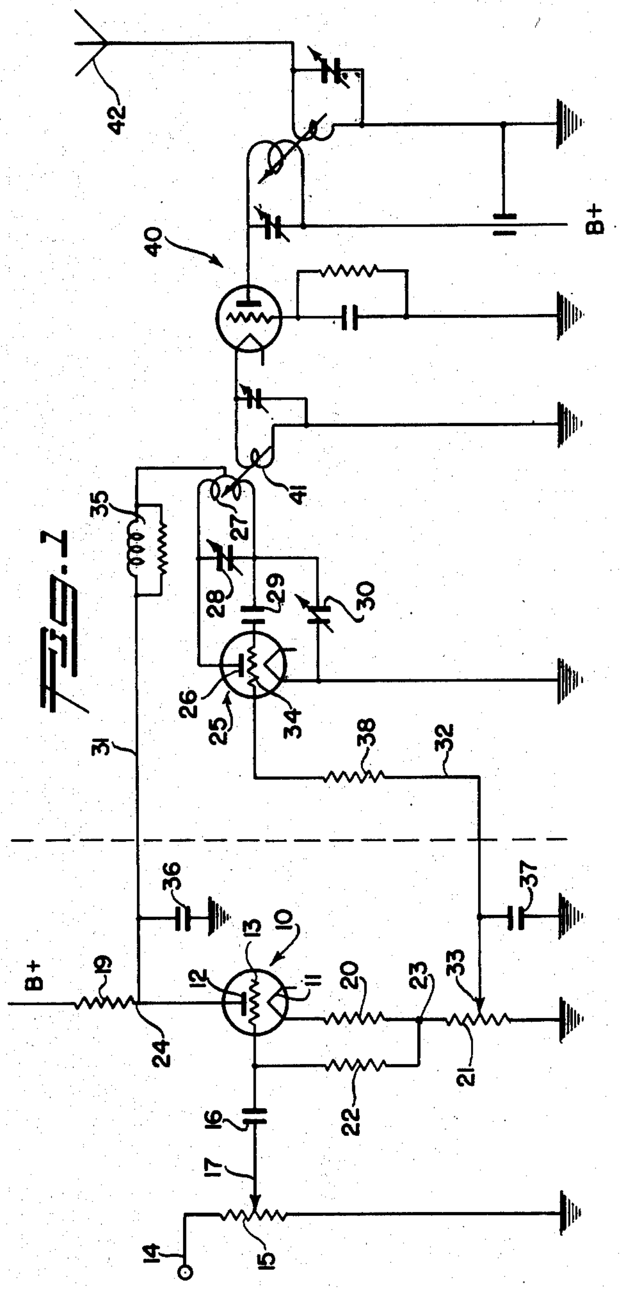
Figure 1 is a diagram of a typical preferred circuit of the invention associated with an amplifier circuit.

In the drawings I have illustrated the circuits of the invention associated with a more or less typical oscillator circuit and an amplifier, it being understood that, as above pointed out, the amplifier may be omitted if desired or required, in which event the oscillator may be coupled directly with the antenna or other load.

The modulator circuit of the invention includes a modulator tube 10 in the form of a triode having a cathode 11, a plate 12 and a grid 13. In practice, the tube 10 may be a 6K4 tube, or other standard electronic tube, although it is to be understood that the character of the tube 10 may be varied to adapt the circuit for specific uses or applications. The signal voltage, which is a varying amplitude voltage, is applied at 14 to the grid 13 of the tube 10 through a gain control potentiometer 15 which is adapted to adjust the amplitude of the signal voltage applied to the grid. A capacitor 16, offering negligible impedence to the signal voltage, is interposed in the tap or lead 17 extending from the potentiometer 15 to the grid 13 to maintain the grid at a different D. C. potential than that of the potentiometer. The plate supply of the tube 10 incorporates an impedance or resistor 19 and resistances 20 and 21 are interposed in the cathode lead. As will be later described, the impedance element or resistor 21 is in the form of a potentiometer adapted to vary the modulating voltage applied to the oscillator tube grid circuit. A resistor 22 is connected between the grid 13 and the point of juncture 23 of the resistors 20 and 21 to offer a high impedance to the signal circuit current and yet allow the D. C. potential at the grid 13 to be of essentially the same value as at the junction of the resistor 20 and potentiometer 21. Resistor 20 provides a voltage drop due to current flow through the tube 10 and the resistor itself, making the potential of the grid 13 negative with respect to the cathode 11, the value of the resistor 20 being based on the operating conditions selected for the modulator tube 10.

From the foregoing it will be seen that the potentiometer 21, the resistor 20, and the resistor 19, are all series with the modulating tube 10 and the plate current of the tube flows through the potentiometer and the resistors. Any change in the plate current of the tube 10 resulting from a change in voltage at the grid 13 is in the same sense as that voltage change and results in a voltage change in the same sense at the juncture 23 of the resistor 20 and potentiometer 21 but is accompanied by a voltage change in the opposite sense at the point 24 of the plate supply resistor 19. Thus for any given varying amplitude voltage signal applied to the grid 13 of the tube 10 there are voltage changes of opposite sense with respect to each other produced at points 23 and 24. It is these voltage changes of opposite sense properly proportioned to reduce or eliminate amplitude modulation in the oscillator that are applied to or impressed on the oscillator to produce the intended frequency modulation.

In a typical transmitter, the conventional oscillator illustrated may be operated near a frequency of 200 megacycles per second. The tube 25 of the oscillator is associated with the usual tank circuit embodying the inductance 27 and a variable condenser 28. A blocking condenser 29 is connected in the grid circuit of the oscillator and the oscillator-frequency grid-voltage control circuit includes the variable condenser 30. In accordance with the invention, a lead 31 extends from the plate circuit of the modulator tube 10 to the inductance 27 to impress the above described voltage changes of the modulator plate circuit upon the plate 26 of the oscillator tube 25. In the particular arrangement illustrated, the lead 31 is connected with the plate circuit of the modulator tube 10 at the point 24. A lead 32 likewise extends from the adjustable tap 33 of the above described potentiometer 21 to the grid 34 of the oscillator tube 25 to impress the opposite sense voltage changes on the grid 34. An oscillator frequency filter network is incorporated in the plate lead 31 to keep the oscillator frequency power out of the modulator circuit. This network includes high impedance series elements 35 and a low impedance shunt or bypass condenser 36. A bypass condenser 37 and a resistance 38 are connected in the grid lead 32 for the same purpose and the resistance 38 also serves as a grid-leak, or bias resistor for the oscillator circuit.

The frequency of oscillation of the oscillator tube 25 is a function of the transit time of the tube which, for a given tube design, is, in turn, a function of the voltages applied to the tube. Accordingly, an increase in the plate voltage of the oscillator tube 25 will, ordinarily, result in an increase in both the frequency and amplitude of oscillation while a decrease in the grid voltage also results in an increase in the frequency of oscillation but produces a decrease in the amplitude. The frequency increase obtained by increasing the plate voltage or by decreasing the grid voltage of the oscillator tube 25 is due primarily to the reduction in the transit time of the tube electrons occasioned by increased voltage gradients between the tube elements or electrodes and particularly between the oscillator grid 34 and plate 26. Thus, either the plate voltage or the grid voltage, or both, may be varied to obtain frequency modulation. In the circuit illustrated, where the leads 31 and 32 are connected as described, the voltages of both the plate 26 and the grid 34 of the oscillator tube are varied by the previously described operation of the modulator circuit. By selecting a favorable ratio between these voltages, amplitude modulation at the oscillator may be reduced as required and in actual practice may be made negligible, leaving essentially pure frequency modulation with little or no amplitude modulation. Modulation in the opposite sense results from a reversal of the modulating voltages by the above described action of the modulation circuit. In the form of the invention illustrated, the ratio between the modulating voltages applied to the elements of the oscillator tube 25 is so selected or chosen by adjustment of the tap 33 of the potentiometer 21 that the amplitude modulation effects are equal and opposite, thereby cancelling one another while the frequency modulation effects are additive.

In Figure 1, I have shown a typical or conventional amplifier 40 coupled with the inductance 27 of the modulated oscillator by a variable coupling 41. It is to be understood that, as above pointed out, an amplifier is not essential or required in all applications of the invention and the invention is not to be considered as restricted to use in connection with the particular amplifier illustrated or any other amplifier circuit. The amplifier 40, shown in Figure 1, has a variable coupled antenna 42, it being apparent that other forms of loads may be associated with the amplifier.

Figure 2:
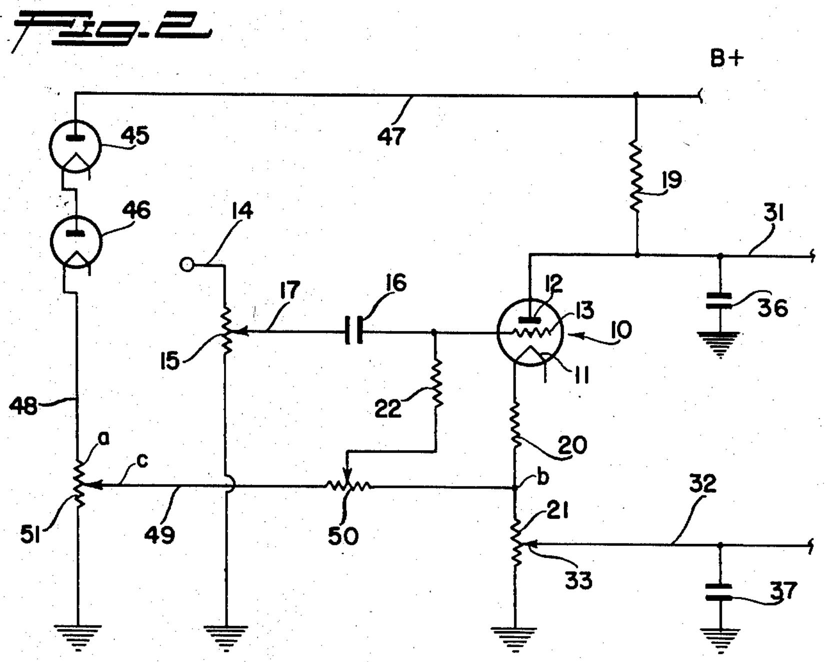
Figure 2 is a diagram of another form of circuit of the invention that may be used with the oscillator circuit of Figure 1 or with other oscillators.

Figure 2 illustrates a modulator circuit of the invention similar to the circuit illustrated in Figure 1 having means for stabilizing the frequency of oscillation with respect to the supply voltage and embodyinging means for preventing variations in the plate supply voltage of the transmitter from causing variations in the operating frequency. It will be assumed that the circuit of Figure 2 is employed with the oscillator shown in Figure 1, it being understood that the invention as illustrated in Figure 2 may be used with other appropriate oscillators. Certain of the elements of the circuit of Fgure 2 may be the same as illustrated in Figure 1 and corresponding reference numerals are applied to corresponding parts in the drawings.

The voltage stabilizing arrangement of Figure 2 includes a lead 47 extending from the plate supply B+ to a constant voltage drop means. In the particular case illustrated, this means includes a pair of gaseous diode tubes 45 and 46, designed to provide an essentially constant voltage drop in the operating range of the circuit. A lead 48 extends from the pair of tubes 45 and 46 to a potentiometer 51 and thence to ground. The voltage stabilizing circuit further includes a lead 49 extending from the adjustable tap *c* of the potentiometer 51 to a point *b* between the above described resistors 21 and 20 of the modulator cathode circuit. A potentiometer 50 is interposed in the lead 49 and in this form of the invention the resistor 22 is connected between the adjustable tap of the potentiometer 50 and the grid lead 17 of the modulator tube 10. The remainder or balance of the modulator circuit may be the same as described in connection with Figure 1, the lead 31 from the plate 12 of the modulator extending to the plate circuit of the oscillator circuit and the lead 32 extending from the tap 33 of the potentiometer 21 to the grid 34 of the oscillator tube 25, as previously described. The modulator operates as above described, the resistors 19 and 21 operating to so proportion the voltage changes of opposite sense impressed on the plate 26 and grid 34 of the oscillator, resulting from the application of the varying amplitude voltages to the grid 13 of the modulator, that amplitude modulation at the oscillator is minimized or eliminated, leaving substantially pure frequency modulation at the oscillator.

The voltage stabilizing circuit of Figure 2 further operates to apply variations in the plate supply voltage to the modulator circuit in such a manner that there is no net change in the frequency of oscillation due to such variations in the supply voltage. The gas tubes 45 and 46 produce a substantially constant voltage drop in the voltage stabilizing circuit throughout the operating range of the circuit. It will be seen that any variation in the plate supply voltage at B+ will also appear at point *a*. The tap at the potentiometer 51 is adjusted so that the normal potential at the tap, that is the potenial when no modulation is present, is the same as the normal potential at the point *b*. Then adjustment of the tap of potentiometer 50 varies the remaining fraction of the change in the plate supply voltage that is applied to the grid 13 of the modulator tube 10. This adjustment of the tap at the potentiometer 50 may be such as to avoid or eliminate frequency changes in the modulator-oscillator circuit that would otherwise result from variations in the plate supply voltage.

Figure 3:
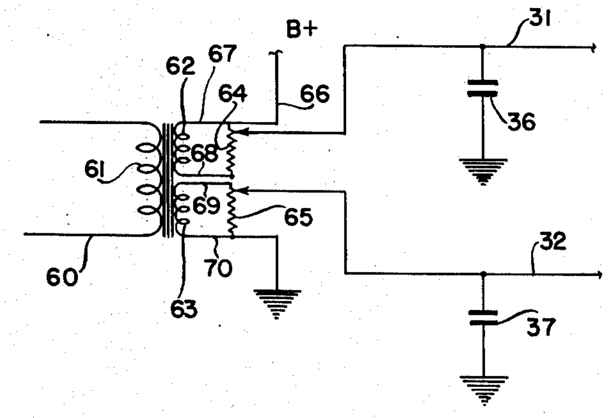
Figure 3 is a diagram of still another circuit of the invention adapted for use with the oscillator of Figure 1 or for use with other appropriate oscillator circuits.

Figure 3 illustrates another form of modulator circuit of the invention characterized by an inductance means or transformer and variable resistance combination for obtaining voltages proportioned in accordance with the invention. This transformer and variable resistance combination replaces the modulator tube 10 and associated circuit employed in the above described embodiments of the invention. In this circuit the modulating signal is supplied by a circuit 60 leading to the primary 61 of the transformer. The transformer has two secondary windings 62 and 63 and the oscillator plate supply 66 is connected with one terminal 67 of the secondary winding 62. The above described lead 31 embodying the network 35—36 and which extends to the plate circuit of the oscillator is variably or adjustably connected with the other terminal 68 of the secondary winding 62 while the above described lead 32, extending from the grid 34 of the oscillator and including the resistance 38 and bypass condenser 37 is adjustably connected with one terminal or end 69 of the other secondary winding 63. The signal voltage at the terminal 67 of winding 64 has the same phase relationship to the terminal 68 that the voltage at the terminal 69 of the winding 65 has with respect to the terminal 70 of winding 65. In other words the modulating voltage applied to the oscillator plate circuit from the terminal 67 to the tap of the lead 31 is opposite in phase to the modulating voltage applied to the oscillator grid circuit from the terminal 70 to the tap of the lead 32, in accordance with the conditions of operation of the invention. While appropriate or selected turns of the secondary windings 62 and 63 may have individual taps and either one or both of the related leads 31 and 32 may have adjustable taps or sliders for cooperating with such taps of the windings 62 and 63, I have shown resistors 64 and 65 connected across the poles of the windings 62 and 63 with the adjustable taps of the leads 31 and 32 cooperating with the resistors. In practice only one of these taps need be adjustable, or if the required proportion of voltages is known the resistance varying elements may be omitted from the circuit. It will be seen that by adjusting the tap of the lead 31 the voltage impressed upon the plate circuit of the oscillator may be varied at will and in a like manner the voltage impressed on the oscillator grid 34 may be altered at will by adjusting the tap of the lead 32 along the resistor 65.

As in the previously described form of the invention, the circuit of Figure 3 is operable or adjustable to obtain a ratio between the voltages impressed on the plate and grid 26 and 34 of the oscillator to reduce or practically eliminate amplitude modulation at the oscillator. Ordinarily an increase in the plate voltage of the oscillator tube 25 results in an increase in both the frequency and amplitude of oscillation while a decrease in grid voltage results in an increase in the frequency of oscillation but causes a decrease in amplitude. With the circuit shown in Figure 3 either the voltage applied to the plate 26 or the voltage applied to the grid 34, or both, may be varied by the adjustable taps at the resistors 64 and 65. By properly selecting or relating these voltages in this manner, amplitude modulation at the oscillator is reduced or made negligible leaving frequency modulation with little or no amplitude variation. With the circuit of Figure 3, the ratio between the modulating voltages applied to the plate and grid of the oscillator tube 25 may be selected and related as described so that the amplitude modulation effects are equal and opposite, thereby cancelling one another while the frequency modulation effects become additive.

Having described only typical preferred forms of the invention I do not wish to be limited to the specific details set forth but wish to reserve to myself any features or modifications that may fall within the scope of the following claims.

I claim:

1. A modulator circuit for use with a radio-frequency oscillator having at least three spaced electrodes with electron flow therebetween, said circuit comprising a vacuum tube having a plate, a grid and a cathode, a plate supply for said tube having a resistor, a cathode lead for said tube having a resistor, means for applying varying amplitude voltages to the grid, a connection between said plate supply and one of said oscillator electrodes, and a connection between said cathode lead and another of said electrodes, said resistors being related so that the voltage changes of opposite sense impressed on said two electrodes as a result of the application of the varying amplitude voltages to said grid are so proportioned that amplitude modulation at the oscillator is minimized leaving substantially pure frequency modulation at the oscillator.

2. A modulator circuit for use with a radio-frequency oscillator having at least three spaced electrodes with electron flow therebetween, said circuit comprising a vacuum tube having a plate, a grid and a cathode, a plate supply for said tube, a cathode lead for said tube, a connection between said plate supply and one of said electrodes, a connection between said cathode lead and another of said electrodes, means for applying voltages of varying amplitude to the grid to thereby impress voltage changes on the two last mentioned electrodes and vary the transit time of the electron flow therebetween, and resistors in said plate supply and cathode lead related so that the voltage changes of opposite sense impressed on said two electrodes produce additive effects on said variation of said transit time and the amplitude modulation at the oscillator is minimized, one of the resistors being variable to control the ratio between the voltage changes impressed on said two electrodes.

3. A modulator circuit for use with a radio-frequency oscillator having at least three spaced electrodes with electron flow therebetween said circuit comprising means for receiving varying amplitude voltage signals and directly impressing said signals on two of said electrodes in the form of voltage changes of opposite sense to vary the transit time of the electron flow between said two electrodes and to vary the frequency of oscillation of the oscillator, and resistance means in the circuit of one of said two electrodes for proportioning said voltage changes so that the effects of said variations in said transit time are additive and the effects on the amplitude of the oscillations are mutually cancelling to minimize variations in the amplitude of the oscillations of the oscillator.

4. A modulator circuit for use with a radio-frequency oscillator having at least three spaced electrodes with electron flow therebetween said circuit comprising means for receiving varying amplitude voltage signals and directly impressing said signals on two of said electrodes in the form of voltage changes of opposite sense to vary the transit time of the electron flow between said two electrodes and to vary the frequency of oscillation of the oscillator, and means in the circuit of said two electrodes for proportioning said voltage changes so that the effects of said variations in said transit time are additive and the effects on the amplitude of the oscillations are mutually cancelling to minimize variations in the amplitude of the oscillations of the oscillator, the last named means including a variable resistor for controlling said proportioning of the voltage changes.

5. A modulator system for use with a radio-frequency oscillator having at least three spaced electrodes with electron flow therebetween, the modulator system comprising a vacuum tube circuit including a plate supply, a cathode lead and a grid, a connection between the plate supply and one of said electrodes, a connection between the cathode lead and another of said electrodes, means for applying a signal voltage of varying amplitude to the grid to thereby provide voltage changes at the two last named electrodes and thus vary the transit time of the electron flow therebetween, and resistor means associated with the vacuum tube circuit constructed and arranged so that said voltage changes impressed on said two electrodes are of opposite sense, said resistor means so proportioning said voltage changes to cause the effects of said changes in said transit time to be additive and to minimize or eliminate amplitude modulation at the oscillator.

6. In a transmitter the combination of a radio-frequency oscillator including a vacuum tube having a cathode, a grid and a plate, a modulator circuit including a modulator vacuum tube having a plate, a grid and a cathode, a plate supply for the last named tube, a lead for the last named cathode, means for applying a modulating signal to the grid of the modulator tube, a connection between said plate supply of the modulator tube and the plate of the oscillator, a connection between said cathode lead of the modulator and the grid of the oscillator tube, resistors in the plate supply and said cathode lead, and means for varying the action of one of said resistors so that the voltage changes of opposite sense impressed on the plate and grid of the oscillator by the modulator circuit as a result of the application of said signal to the grid of the modulator are so proportioned that amplitude modulation at the oscillator is minimized leaving substantially pure frequency modulation.

7. In a transmitter the combination of a radio-frequency oscillator including a vacuum tube having a cathode, a grid and a plate, a modulator circuit including a modulator vacuum tube having a plate, a grid and a cathode, a plate supply for the last named tube, a lead for the last named cathode, means for applying a modulating signal to the grid of the modulator tube, a connection between said plate supply of the modulator tube and the plate of the oscillator, a connection between said cathode lead of the modulator and the grid of the oscillator tube, resistors in the plate supply and said cathode lead, means for varying the action of one of said resistors so that the voltage changes of opposite sense impressed on the plate and grid of the oscillator by the modulator circuit as a result of the application of said signal to the grid of the modulator are so proportioned that amplitude modulation at the oscillator is minimized leaving substantially pure frequency modulation, and a circuit associated with the plate supply, cathode lead and grid of the modulator circuit for eliminating net changes in the frequency of oscillation due to variations in the plate supply voltage.

8. A modulator circuit for use with a radio-frequency oscillator having at least three spaced electrodes with electron flow therebetween, said circuit comprising a vacuum tube having a plate, a grid and a cathode, a plate supply for said tube having a resistor, a cathode lead for said tube having a resistor, means for applying varying amplitude voltages to the grid, a connection between said plate supply and one of said oscillator electrodes, and a connection between said cathode lead and another of said electrodes, said resistors being related so that the voltage changes of opposite sense impressed on said two electrodes as a result of the application of the varying amplitude voltages to said grid are so proportioned that amplitude modulation at the oscillator is minimized leaving substantially pure frequency modulation at the oscillator, and a circuit associated with the plate supply, cathode lead and grid for eliminating net changes in the frequency of oscillation as a result of changes in the plate supply voltage.

9. A modulator circuit for use with a radio-frequency oscillator having at least three spaced electrodes with electron flow therebetween, said circuit comprising a vacuum tube having a plate, a grid and a cathode, a plate supply for said tube having a resistor, a cathode lead for said tube having a resistor, means for applying varying amplitude voltages to the grid, a connection between said plate supply and one of said oscillator electrodes, and a connection between said cathode lead and another of said electrodes, said resistors being related so that the voltage changes of opposite sense impressed on said two electrodes as a result of the application of the varying amplitude voltages to said grid are so proportioned that amplitude modulation at the oscillator is mimimized leaving substantially pure frequency modulation at the oscillator, and a circuit associated with the plate supply, cathode lead and grid for eliminating net changes in the frequency of oscillation as a result of changes in the plate supply voltage including a constant voltage drop means connected with the plate supply, a variable resistor connected with said voltage drop means and having a lead extending to the cathode lead, and a variable resistor in the last named lead having an adjustable tap connected with the grid.

10. The combination according to claim 1 in which said means for applying said voltage changes includes a circuit carrying a modulating signal, transformer means including a primary winding receiving said signal from said circuit, and two secondary windings, a connection between one secondary winding and one of said electrodes, a connection between the other secondary winding and the grid, and voltage dividing means in at least one of said connections for proportioning the voltage changes applied to said two electrodes by said secondary windings to minimize variations in the amplitude of the oscillations of the oscillator and to obtain variations in the frequency of said oscillations which are in accordance with the modulating signal.

11. The combination according to claim 1 in which said means for applying said voltage changes includes a circuit carrying a modulating signal, transformer means including a primary winding receiving said signal from said circuit, and two secondary windings, a connection between one secondary winding and one of said electrodes, a connection between the other secondary winding and another of said electrodes, and in which said means for proportioning the voltage changes includes variable resistance means in at least one of said connections for proportioning the voltage changes applied to the two said electrodes by said secondary windings to minimize variations in the amplitude of the oscillations of the oscillator and to obtain variations in the frequency of said oscillations which are in accordance with the modulating signal.

12. The combination according to claim 1 in which said means for applying said voltage changes includes a circuit carrying a modulating signal, transformer means including a primary winding receiving said signal from said circuit, and two secondary windings, a connection between one secondary winding and one of said electrodes, a connection between the other secondary winding and another of said electrodes, a current supply for one of the secondary windings, and in which said means for proportioning the voltage changes includes variable resistors in said connections for proportioning the voltage changes applied to the two said electrodes to minimize variations in the amplitude of the oscillations of the oscillator and to obtain variations in the frequency of said oscillations.

13. In combination; an oscillator including at least three spaced electrodes having electron flow therebetween, and a circuit directly applying voltage changes of opposite sense to two of said electrodes, said voltage changes modifying the transit time of the electron flow between said electrodes and varying the frequency of oscillation of the oscillator, said circuit including means for so proportioning said voltage changes that the effects of said modifications of said transit time are additive to minimize amplitude modulation at the oscillator leaving substantially pure frequency modulation at the oscillator.

References Cited in the file of this patent

UNITED STATES PATENTS

| Number | Name | Date |
|---|---|---|
| 2,314,161 | Rankin | Mar. 16, 1943 |
| 2,341,243 | Shock | Feb. 8, 1944 |
| 2,376,392 | Shepherd | May 28, 1945 |

FOREIGN PATENTS

| Number | Country | Date |
|---|---|---|
| 629,184 | Germany | Apr. 24, 1936 |